United States Patent
Conley, Jr. et al.

(10) Patent No.: US 6,875,677 B1
(45) Date of Patent: Apr. 5, 2005

(54) METHOD TO CONTROL THE INTERFACIAL LAYER FOR DEPOSITION OF HIGH DIELECTRIC CONSTANT FILMS

(75) Inventors: John F. Conley, Jr., Camas, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 30 days.

(21) Appl. No.: 10/677,035

(22) Filed: Sep. 30, 2003

(51) Int. Cl.$^7$ ............................................. H01L 21/3205
(52) U.S. Cl. ..................... 438/585; 435/287; 435/197
(58) Field of Search ................................ 438/585, 287, 438/197

(56) References Cited

U.S. PATENT DOCUMENTS

| | | | |
|---|---|---|---|
| 6,013,553 A | * | 1/2000 | Wallace et al. ............. 438/287 |
| 6,620,713 B2 | * | 9/2003 | Arghavani et al. .......... 438/585 |
| 6,750,066 B1 | * | 6/2004 | Cheung et al. ................ 438/3 |

OTHER PUBLICATIONS

Article entitled: Nucleation and interface formation mecahanisms in atomic layer deposition of gate oxides; by Frank and Chabal, published in Applied Physics Letters, vol. 82, No. 26, Jun. 30, 2003.

Article entitled: Enhanced initial growth of atomic–layer–deposited metal oxided on hydrogen–terminated silicon; by Frank and Chabal, published in Applied Physics Letters, vol. 83, No. 4, Jul. 28, 2003.

Article entitled: Nucleation and growth of atomic layer deposited HfO$_2$ gate dielectric layers on chemical oxide (Si–O–H) and thermal oxide (SiO$_2$ or Si–O–N) underlayers; by Green et al., published in Journal of Applied Physics, vol. 92, No. 12, Dec. 15, 2002.

Article entitled: Atomic Layer Deposition of Hafnium Oxide Using Anhydrous Hafnium Nitrate; by Conley et al., published in Electrochemical and Solid–State Letters, available electronically Feb. 26,2002.

Article entitled: Atomic layer deposition of thin hafnium oxide films using a carbon free predursor; by Conley and Solanki, published in Journal of Applied Physics, vol. 93, No. 1, Jan. 1, 2003.

* cited by examiner

*Primary Examiner*—Luan Thai
(74) *Attorney, Agent, or Firm*—Matthew D. Rabdau; David C. Ripma; Joseph P. Curtin

(57) ABSTRACT

Methods of forming an interfacial layer on a hydrogen-passivated substrate are provided. These methods utilize atomic layer deposition techniques incorporating metal nitrate-based precursors, such as hafnium nitrate or zirconium nitrate, without introducing a hydrating agent, or oxidizing agent, such as water, during the formation of the interfacial layer. Also provided are methods of forming high-k films, by first forming an interfacial layer on the surface of a hydrogen-passivated substrate, and then depositing one, or more, high-k dielectric films.

13 Claims, 4 Drawing Sheets

METHOD TO CONTROL THE INTERFACIAL LAYER FOR DEPOSITION OF HIGH DIELECTRIC CONSTANT FILMS

BACKGROUND OF THE INVENTION

The present invention relates generally to methods of forming thin films and, more particularly, to methods of forming high dielectric constant films on hydrogen-passivated substrates.

Current Si VLSI technology uses $SiO_2$ as the gate dielectric in MOS devices. As device dimensions continue to scale down, the thickness of the $SiO_2$ layer must also decrease. Thicknesses of less than 1 nanometer (nm) are expected in the future. However, the occurrence of high tunneling current through such thin layers of $SiO_2$ requires that alternate materials be considered. Materials with high dielectric constants would permit gate dielectric layers to be made thicker, and so alleviate the tunneling current problem. These so-called high-k dielectric films are defined herein as having a high dielectric constant relative to silicon dioxide. Typically, silicon dioxide has a dielectric constant of approximately 4, while it would be desirable to use a gate dielectric material with a dielectric constant of greater than approximately 10.

Because of high direct tunneling currents, $SiO_2$ films thinner than 1.5 nm generally cannot be used as the gate dielectric in CMOS devices. There are currently intense efforts in the search for the replacement of $SiO_2$. Metal oxides, such as hafnium oxide ($HfO_2$) and zirconium oxide ($ZrO_2$), are leading candidates for high-k dielectric materials. The dielectric constant of these materials is about 20 to 25, which is a factor of 5–6 times that of silicon dioxide, meaning that a thickness of about 5–6 nm of these materials could be used to achieve an equivalent oxide thickness (EOT) of about 1.0 nm, assuming that the entire film is essentially composed of the high-k material. One problem with using high-k materials is that an interfacial layer of silicon dioxide, or a silicate layer, with a lower dielectric constant forms during standard processing. Achieving EOT of less than 1.5 nm is very difficult. An EOT of about 1.0 nm, and below, is expected to be used for the 0.07 micrometer device generation.

Deposition of $ZrO_2$, or $HfO_2$, using atomic layer deposition (ALD) tetrachloride precursors has been reported. Substrates heated to between 300° C. and 400° C. have been exposed to $ZrCl_4$, or $HfCl_4$, precursors alternating with water vapor in an attempt to form $ZrO_2$ or $HfO_2$ films respectively. However, it is difficult to initiate deposition on hydrogen terminated silicon surfaces. Hydrogen terminated silicon surfaces result from standard industry cleaning processes. These standard cleaning processes, which are often referred to as HF last clean, typically end in a quick dip in dilute HF. This produces surfaces which are hydrogen terminated, also known as hydrogen passivated. With sufficient exposure of the silicon surface to the reactants, the deposition may eventually be initiated. But, this results in films that are rough with poor uniformity. Another problem with tetrachloride precursors is the incorporation of residual chlorine in the film. The chlorine impurities can result in long term reliability and performance issues.

Other precursors use Hf or Zr metal combined with organic ligands such as iso-propoxide, TMHD (2,2,6,6-tetramethyl-3,5-heptanedionate), or combinations of organic ligands with chlorine. These precursors also have a problem initiating the film deposition on hydrogen terminated silicon surfaces and will incorporate carbon residues in the film. Large ligands may also take up enough space that steric hindrance will prevent the deposition of a uniform monolayer. Up until now, the successful implementation of ALD Zr and Hf oxides have been either on an initial layer of silicon oxide, silicon oxynitride, or in the form of a reduced dielectric constant silicate film, such as $ZrSiO_4$ or $HfSiO_4$. These initial layers may contribute significantly to the overall EOT.

The use of metal nitrate precursors, such as $Hf(NO_3)_4$ and $Zr(NO_3)_4$, has been shown to provide a means for depositing films onto hydrogen passivated surfaces, even at low temperatures required for ALD. Problems related to the interfacial layer, such as the formation of silicon oxides or silicates, may remain even using metal nitrate precursors. This may be, in part, due to the presence of $H_2O$, during the formation of the interfacial layer, for example in a process employing alternating exposures, such as $M(NO_3)_x/H_2O$ (where M is a metal and x is the valence of M). The presence of $H_2O$ may affect the interfacial layer due to the presence of hydrogen, or due to the additional oxygen provided. Another possible cause is that the $NO_3$ ligand is highly reactive and may promote the formation of silicate, or silicon oxide, at the interface even at moderate temperatures in the range of 300 to 450 degrees Celsius. Another factor may be that the amount of oxygen in the $M(NO_3)_x$ in excess of that required to form the desired metal-oxide film, for example using $Hf(NO_3)_4$ (12:1 O:Hf ratio) to deposit $HfO_2$ (2:1 O:Hf ratio).

SUMMARY OF THE INVENTION

Accordingly, a method is provided to deposit a high-k material by first forming an interfacial layer overlying a hydrogen passivated surface. The hydrogen passivated surface is exposed to a metal nitrate containing precursor without a hydrating gas, or an oxidizing gas, being introduced until the interfacial layer is formed to a desired thickness, which may be a self-limited thickness. $H_2O$ may act as either an oxidizing gas, or a hydrating gas and so will not be introduced during the formation of the interfacial layer.

The metal nitrate containing precursor has the formula $M(NO_3)_x$, where M is a metal selected from the group consisting of Hf, Zr, Gd, La, Ce, Ti, Y, Ta, and Al; and x is the valence of M.

Additional high-k material may then be deposited over the interfacial layer. The additional high-k material may be the same material as the interfacial layer, or a different high-k material.

For example, a $HfO_2$ interfacial layer may be formed followed by a high-k material selected from $ZrO_2$, $Gd_2O_3$, $La_2O_3$, $CeO_2$, $TiO_2$, $Y_2O_3$, $Ta_2O_5$, $Al_2O_3$, $HfAlO_x$, $ZrAlO_x$, or $HfZrO_x$.

DETAILED DESCRIPTION OF THE INVENTION

Figure 1:
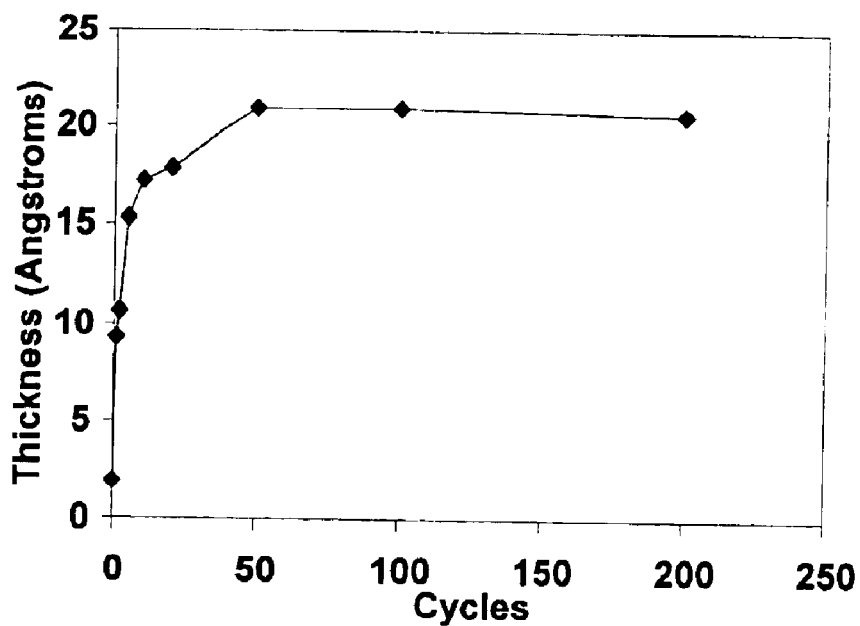
FIG. 1 is a plot of interfacial layer thickness as a function of the number of precursor cycles

FIG. 1 is a chart showing the film thickness in angstroms of an interfacial layer formed using a $M(NO_3)_x$ precursor (where M is metal and x is the valence of M), in this example $Hf(NO_3)_4$. Generally, M may be Hf, Zr, Gd, La, Ce, Ti, Y, Ta, or Al. The interfacial layer was formed by providing a hydrogen passivated semiconductor surface, in this case hydrogen terminated silicon, in an ALD chamber, and exposing the surface to cycles comprising two seconds of $Hf(NO_3)_4$ and ten seconds of $N_2$ at a temperature of approximately 170 degrees Celsius. This interfacial layer initially increases with the number of cycles, but then saturates or self-limits. As shown, using $Hf(NO_3)_4$ at 170 degrees Celsius this saturation occurs after about 50 cycles, or 100 seconds total pulse time, of $Hf(NO_3)_4$. The interfacial layer shown in FIG. 1 saturates, or self-limits, at between approximately 20 and 22 angstroms. The interfacial layer is preferably a high-k material. A high-k material refers to a material with a dielectric constant higher than that of silicon dioxide.

The deposition rate using an equivalent amount of exposure to $Hf(NO_3)_4$ without the nitrogen purges has substantially the same growth rate. So that 100 seconds of $Hf(NO_3)_4$ would produce essentially the same thickness as the 50 cycles shown. Accordingly, the use of nitrogen pulses is not required, but may be used to improve uniformity.

Figure 2:
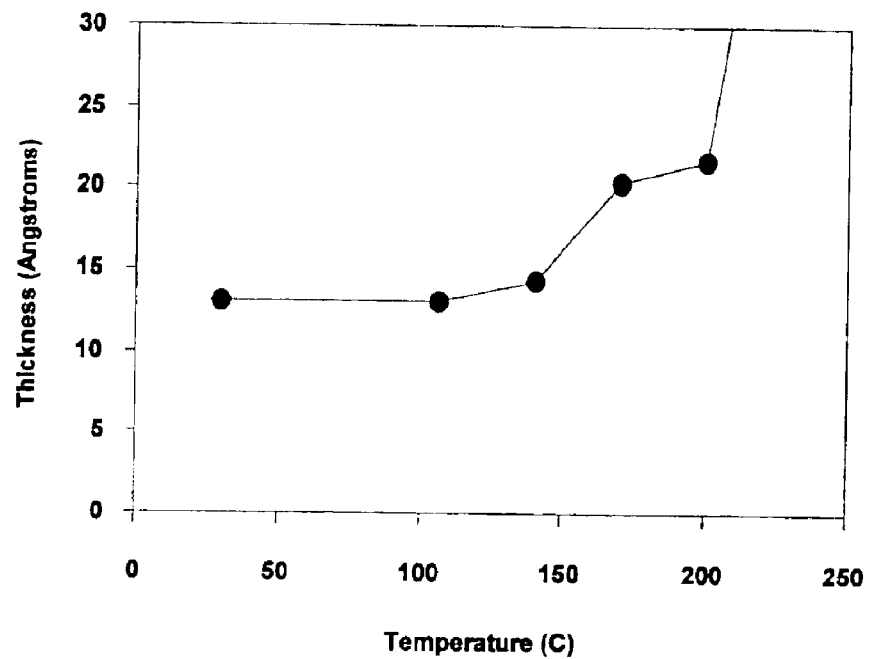
FIG. 2 is a plot of the self-limited thickness of the interfacial layer as a function of temperature.
Figure 3:
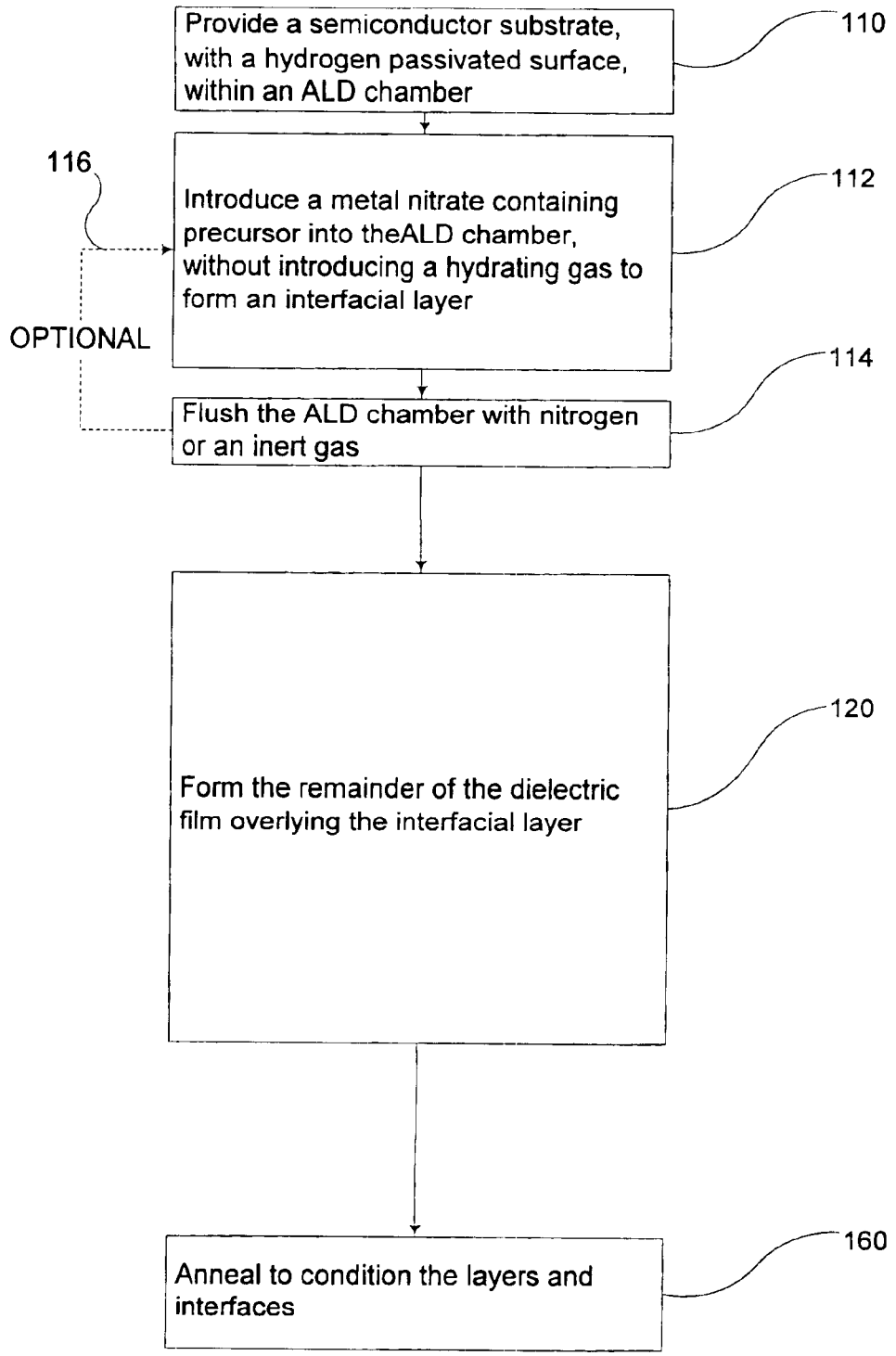
FIG. 3 is flow chart of an embodiment of the present process.

FIG. 2 shows the self-limiting thickness of films, which were produced using $Hf(NO_3)_4$ in connection with the method described above, as a function of temperature. FIG. 2 suggests that for $Hf(NO_3)_4$ at approximately 200 degrees Celsius the process changes, and may no longer be self-limiting. For $Hf(NO_3)_4$ the deposition temperature is preferably between approximately 30 and 200 degrees Celsius. Although the exact temperature may vary depending on the equipment used, chamber pressure, precursor purity, and the $M(NO_3)_x$ precursor used, one of ordinary skill in the art will be able to determine this temperature without undue experimentation. To achieve the full benefit of the present method, it would be preferable to stay below the temperature at which the process is not longer self-limiting, which will be below the decomposition temperature of the $M(NO_3)_x$ precursor used. For $Hf(NO_3)_4$ the decomposition temperature is approximately 250 degrees Celsius.

Figure 4:
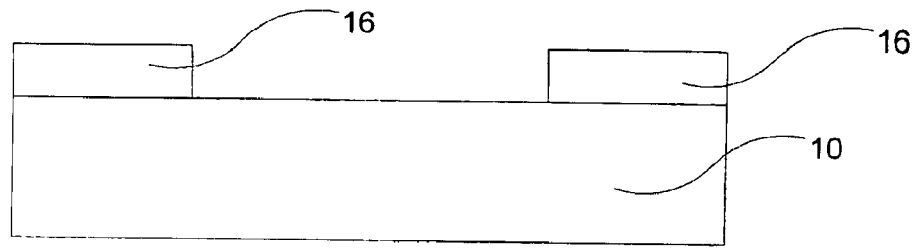
FIG. 4 is a cross-sectional view of a substrate.
Figure 5:
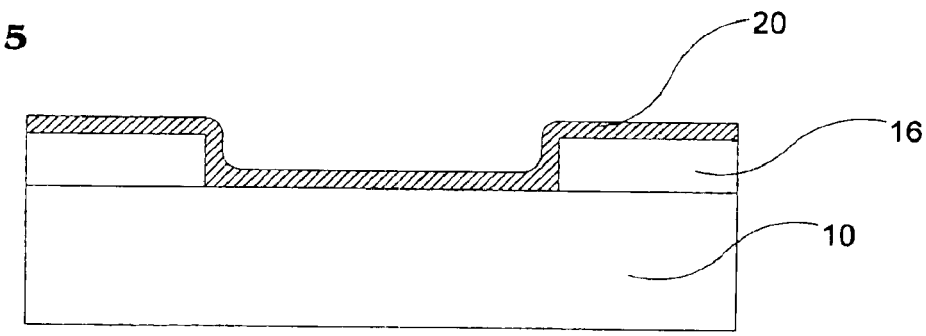
FIG. 5 is a cross-sectional view of an interfacial layer on the substrate.
Figure 6:
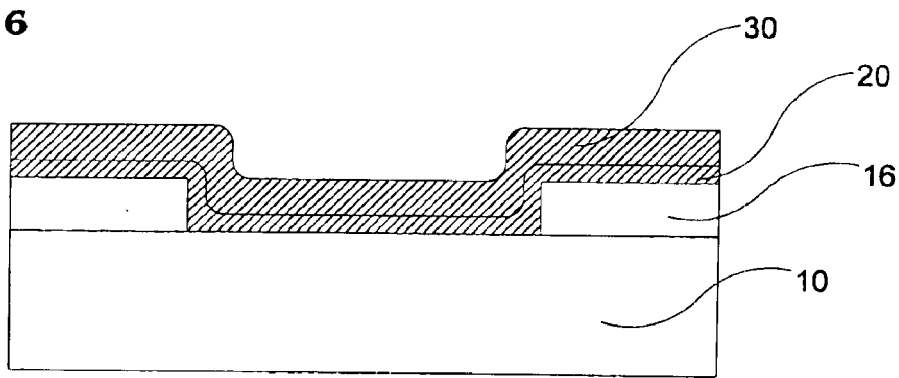
FIG. 6 is a cross-sectional view of an additional high-k layer on the interfacial layer.

Referring now to FIGS. 3–6, FIG. 3 is a flowchart illustrating process steps, while FIGS. 4–6 are cross-sectional views of the substrate during processing. Step 110 provides with a hydrogen-passivated surface within an ALD chamber. FIG. 4 shows a substrate 10 with a hydrogen-passivated surface 12. For purpose of this illustration, a field oxide 16 is shown, which might correspond to a replacement gate process. For the sake of illustration, additional details are not shown. For example, source and drain regions may have been previously formed although not shown here.

Step 112 introduces a metal nitrate comprising precursor of the form $M(NO_3)_x$, where M is a metal and x is the valence of M, into the ALD chamber to form the interfacial layer. The metal M may be Hf, Zr, Gd, La, Ce, Ti, Y, Ta, or Al. During the formation of the interfacial layer, the presence of $H_2O$, any additional hydrating gas, oxidizing gas, or any other reactive gas should be avoided. The phrases "without hydrating gas," "without oxidizing gas," or similar phrases should be understood to mean that additional hydrating, oxidizing, or reactive gas is not being purposely introduced. It is preferable for these gases to be eliminated to within the limits of the ALD chamber being used. After introducing the metal nitrate comprising precursor, the chamber is purged with nitrogen, or an inert gas as shown in step 114. In one embodiment the precursor will be pulsed alternately with the purge, as indicated by process arrow 116. The alternating process can continue as desired, for example until the interfacial layer has reached saturation, and the process becomes self-limited. In another embodiment, the precursor is introduced for a period of time, without intermediate purge cycles. After which, the ALD chamber is purged prior to introducing the precursor used to deposit the remainder of the dielectric material. FIG. 5 shows the substrate 10 following formation of the interfacial layer 20.

For example, $Hf(NO_3)_4$ is used to form an interfacial layer of $HfO_2$. In one embodiment, $Hf(NO_3)_4$ is exposed on the hydrogen passivated substrate to form the interfacial layer. In another embodiment, $Hf(NO_3)_4$ is pulsed with alternating purges, using for example nitrogen, to form the interfacial layer. Either of these processes can be run until the interfacial layer has reached its self-limiting thickness. Although the interfacial layer 20 is self-limiting, in some embodiments the interfacial layer is not fully formed before proceeding to successive deposition steps. In this case, it is used only to initiate ALD on hydrogen terminated Si surface. The interfacial layer 20 will preferably be allowed to proceed up to 75% or more of the self-limiting thickness.

Step 120 forms a high-k dielectric film 30, shown in FIG. 6, overlying the interfacial layer 20. The remainder of the dielectric film may comprise the same material as the interfacial layer. For example, cycling a hafnium-containing precursor; a purging gas; a hydrating gas, an oxidizing gas, or another precursor; and a purging gas to produce the remainder of the high-k film. Cycles for producing $HfO_2$, include the following examples: $Hf(NO_3)_4$/purge/$H_2O$/purge; $HfCl_4$/purge/$H_2O$/purge; $Hf(tmhd)_4$/purge/$H_2O$/purge; or $Hf(NO_3)_4$/purge/$HfCl_4$/purge. The $H_2O$ may be used as a hydrating gas, an oxidizing gas, or both.

Step 160 shows an anneal step. In an embodiment, the interfacial layer and the additional high-k material is annealed after the additional high-k material is deposited. In another embodiment of the present method, the interfacial layer is annealed prior to depositing additional high-k material.

Figure 7:
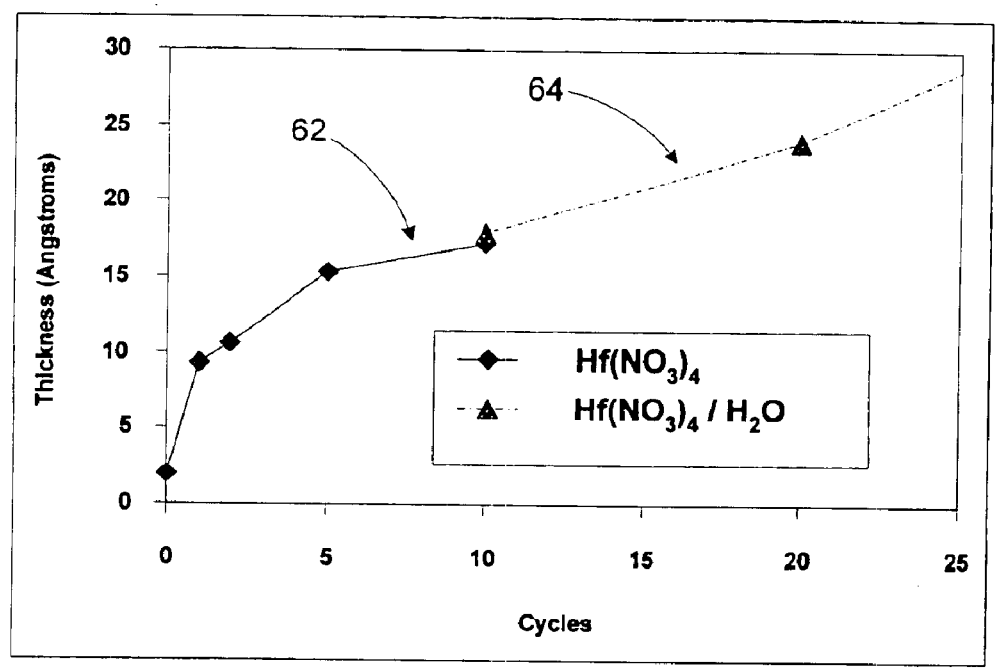
FIG. 7 is a plot of thickness versus precursor cycles for an example of an interfacial layer followed by an additional high-k layer.

FIG. 7 shows film thickness versus cycles for a $HfO_2$ interfacial layer and high-k dielectric layer. $Hf(NO_3)_4$ is used without $H_2O$ to produce the interfacial layer over the hydrogen passivated surface. As shown by region 62, the interfacial layer is approaching its self-limited thickness. The process then alternates between pulses of $Hf(NO_3)_4$ and $H_2O$, with intervening nitrogen purges to produce the remainder of the high-k dielectric layer, shown by region 64, until a suitable thickness is achieved.

The high-k dielectric layer 30 does not need to be the same material as the interfacial layer 20. Even if an $HfO_2$ interfacial layer 20 is used, the high-k dielectric layer could be for example: $ZrO_2$, $Gd_2O_3$, $La_2O_3$, $CeO_2$, $TiO_2$, $Y_2O_3$, $Ta_2O_5$, $Al_2O_3$, $HAlO_x$, $ZrAlO_x$, or $HfZrO_x$. For depositing the high-k dielectric layer 30, any suitable precursor can be used, including nitrate precursors, chlorides, or organic precursors. Alternatively, the interfacial layer may be formed using a different material deposited using an $M(NO_3)_x$ precursor.

What is claimed is:

1. A method of forming a high-k dielectric film on a substrate comprising the steps of:

a) providing a hydrogen passivated surface on a semiconductor substrate within an atomic layer deposition chamber;

b) forming an interfacial layer by heating the substrate to a temperature below 200 degrees Celsius and introducing anhydrous hafnium nitrate into the chamber without introducing a hydrating gas, or an additional oxidizing gas, during the formation of the interfacial layer; and c) forming a high-k film overlying the interfacial layer.

2. The method of claim 1, wherein the substrate has a silicon surface.

3. The method of claim 1, wherein the substrate is heated to a temperature in the range of approximately 30 to 200° C. during formation of the interfacial layer.

4. The method of claim 1, wherein forming the interfacial layer cycles anhydrous hafnium nitrate with a nitrogen purge.

5. The method of claim 1, wherein the step of forming a high-k film further comprises repeating the steps of: introducing a hafnium-containing precursor into the chamber, purging the chamber, introducing $H_2O$ into the chamber, and purging the chamber until a desired film thickness is achieved.

6. The method of claim 5, wherein the hafnium-containing precursor is anhydrous hafnium nitrate, hafnium chloride, or hafnium(tmhd)$_x$.

7. The method of claim 1, wherein the step of forming a high-k film overlying the interfacial layer further comprises repeating the steps of: introducing a $HfCl_4$ precursor into the chamber, purging the chamber, introducing $Hf(NO_3)_4$ into the chamber, and purging the chamber until a desired film thickness is achieved.

8. The method of claim 1, wherein the step of forming a high-k film forms a high-k metal oxide film selected from the group consisting of $ZrO_2$, $Gd_2O_3$, $La_2O_3$, $CeO_2$, $TiO_2$, $Y_2O_3$, $Ta_2O_5$, $Al_2O_3$, $HfAlO_x$, $ZrAlO_x$, and $HfZrO_x$.

9. The method of claim 1, wherein the step of forming a high-k film forms a multilayer film comprising alternating layers of metal oxide films selected from the group consisting of $ZrO_2$, $Gd_2O_3$, $La_2O_3$, $CeO_2$, $TiO_2$, $Y_2O_3$, $Ta_2O_5$, $Al_2O_3$, $HfAlO_x$, $ZrAlO_x$, and $HfZrO_x$.

10. A method of forming a high-k dielectric film on a substrate comprising the steps of:

a) providing a hydrogen passivated surface on a semiconductor substrate within an atomic layer deposition chamber;

b) exposing the hydrogen passivated surface to a metal nitrate containing precursor at a temperature below the thermal decomposition temperature for the precursor without a hydrating gas, or an oxidizing gas, to produce self-limiting high-k interfacial layer; and c) repeating the steps of exposing the surface to a metal-containing precursor, purging the chamber, exposing the surface to a hydrating gas, oxidizing gas, or precursor, and purging to deposit additional high-k material.

11. The method of claim 10, wherein the metal nitrate containing precursor has the formula $M(NO_3)_x$, where M is a metal selected from the group consisting of Hf, Zr, Gd, La, Ce, Ti, Y, Ta, and Al; and x is the valence of M.

12. The method of claim 10, wherein the additional high-k material is the same material as the interfacial layer.

13. The method of claim 10, wherein the additional high-k material is different than the interfacial layer.

* * * * *